(12) United States Patent
Nemouchi et al.

(10) Patent No.: US 11,929,290 B2
(45) Date of Patent: Mar. 12, 2024

(54) METHOD OF MANUFACTURING MICROELECTRONIC COMPONENTS

(71) Applicant: COMMISSARIAT A L'ENERGIE ATOMIQUE ET AUX ENERGIES ALTERNATIVES, Paris (FR)

(72) Inventors: Fabrice Nemouchi, Grenoble (FR); Clemens Fitz, Moritzburg (DE); Nicolas Posseme, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 275 days.

(21) Appl. No.: 17/446,312

(22) Filed: Aug. 30, 2021

(65) Prior Publication Data
US 2022/0068724 A1    Mar. 3, 2022

(30) Foreign Application Priority Data

Aug. 31, 2020  (FR) ..................... 20 08840

(51) Int. Cl.
*H01L 29/49*  (2006.01)
*H01L 21/28*  (2006.01)
(Continued)

(52) U.S. Cl.
CPC ............... *H01L 21/823835* (2013.01); *H01L 21/28052* (2013.01); *H01L 21/823864* (2013.01);
(Continued)

(58) Field of Classification Search
CPC ....... H01L 21/28052; H01L 21/823446; H01L 21/823486; H01L 21/823835; H01L 21/823864; H01L 29/6653; H01L 29/6656
See application file for complete search history.

(56) References Cited

U.S. PATENT DOCUMENTS 6,383,906 B1   5/2002  Wieczorek et al.
10,347,545 B2  7/2019  Grenouillet et al.
(Continued)

FOREIGN PATENT DOCUMENTS

CN   105097477 B    12/2017
EP   3 246 948 A1   11/2017

OTHER PUBLICATIONS

French Preliminary Search Report dated May 7, 2021 in French Application 20 08840 filed on Aug. 31, 2020, 14 pages (with English Translation of Categories of Cited Documents & Written Opinion).

*Primary Examiner* — Robert G Bachner
*Assistant Examiner* — Molly K Reida
(74) *Attorney, Agent, or Firm* — Oblon, McClelland, Maier & Neustadt, L.L.P.

(57) ABSTRACT

A method is provided for producing a plurality of transistors on a substrate comprising at least two adjacent active areas separated by at least one electrically-isolating area, each transistor of the plurality of transistors including a gate having a silicided portion, and first and second spacers on either side of the gate, the first spacers being located on sides of the gate and the second spacers being located on sides of the first spacers. The method includes forming the gates of the transistors, forming the first spacers, forming the second spacers, siliciding the gates so as to form the silicided portions of the gates, and removing the second spacers. The removal of the second spacers takes place during the silicidation of the gates and before the silicided portions are fully formed.

14 Claims, 9 Drawing Sheets

(51) Int. Cl.
  *H01L 21/8238*  (2006.01)
  *H01L 27/092*  (2006.01)
  *H01L 29/66*  (2006.01)

(52) U.S. Cl.
  CPC ........ *H01L 27/092* (2013.01); *H01L 29/4933* (2013.01); *H01L 29/6653* (2013.01); *H01L 29/6656* (2013.01)

(56) References Cited

U.S. PATENT DOCUMENTS

| | | |
|---|---|---|
| 2003/0216004 A1 | 11/2003 | Jeong et al. |
| 2005/0040472 A1 | 2/2005 | Oh et al. |
| 2005/0142784 A1* | 6/2005 | Kim ................... H01L 29/6656 438/303 |
| 2006/0255413 A1 | 11/2006 | Oh et al. |
| 2008/0230844 A1 | 9/2008 | Yu et al. |
| 2008/0265365 A1 | 10/2008 | Frohberg et al. |
| 2009/0104782 A1 | 4/2009 | Lu et al. |
| 2011/0068431 A1 | 3/2011 | Knorr et al. |
| 2012/0025318 A1 | 2/2012 | Richter et al. |
| 2012/0068270 A1 | 3/2012 | Gotou |
| 2013/0109173 A1 | 5/2013 | Liu |
| 2013/0270651 A1* | 10/2013 | Chung .............. H01L 29/66545 257/384 |
| 2014/0113455 A1 | 4/2014 | Reimer et al. |

\* cited by examiner

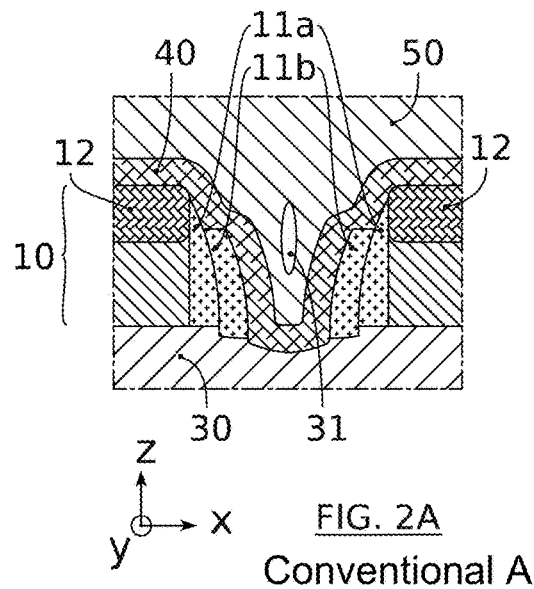 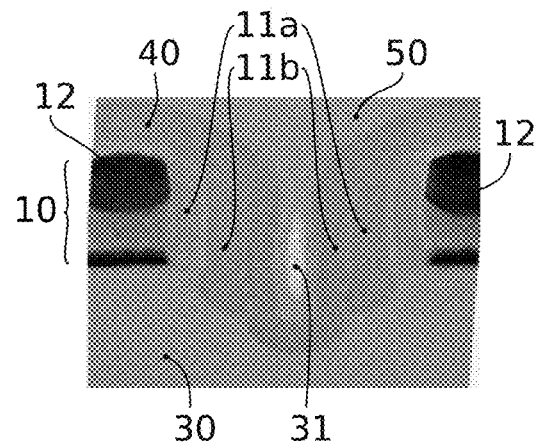
FIG. 2A
Conventional Art
FIG. 2B
Conventional Art
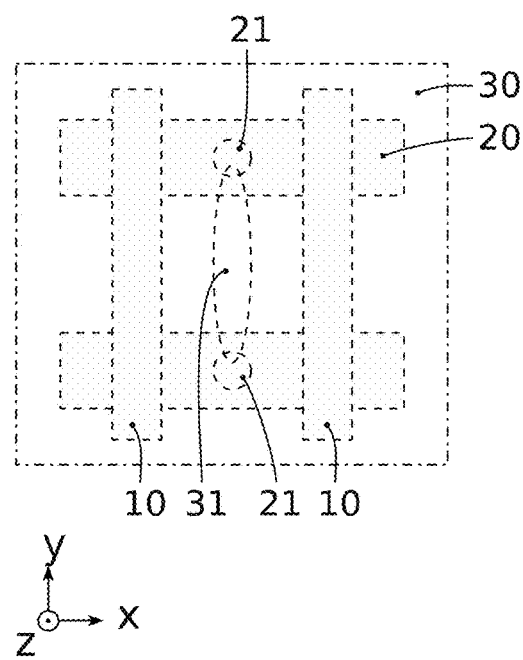 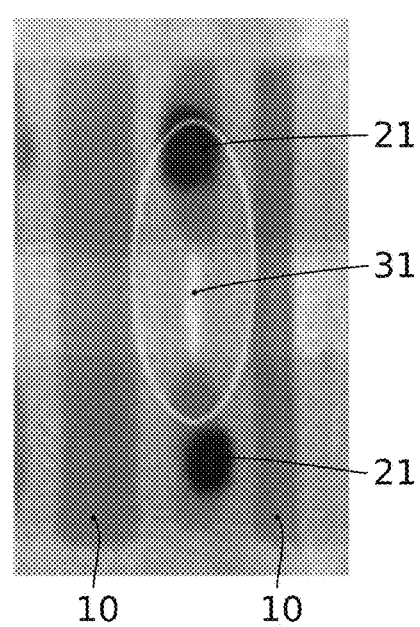
FIG. 3A
Conventional Art
FIG. 3B
Conventional Art

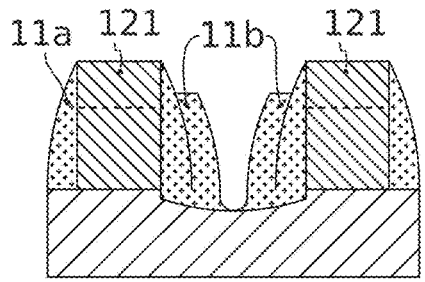
FIG. 12A
- Thermal anneal 0
NiSi module {
- Deposition preparation
- NiPt deposition
- Thermal anneal 1
- Partial NiPt removal
- Thermal anneal 2 — SPT
- Residual NiPt removal
}
FIG. 12B
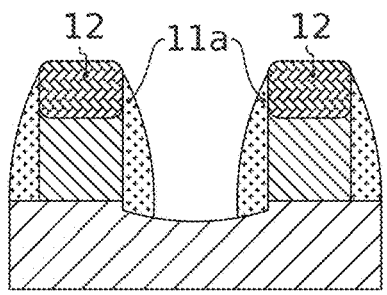
FIG. 12C

METHOD OF MANUFACTURING MICROELECTRONIC COMPONENTS

TECHNICAL FIELD

The present invention relates to the field of manufacturing microelectronic components. It advantageously applies to the manufacture of CMOS transistors (Complementary Metal-Oxide-Semiconductor transistors), however it is not limited thereto.

PRIOR ART

A conventional layout of transistors in a CMOS circuit is shown in FIG. 1A. The gates 10 of the transistors typically extend transversally across a plurality of active areas 20. In order to electrically separate the different active areas 10, for example p-type and n-type areas, shallow isolating trenches STI 30 (shallow trench isolation) are usually formed.

In order to increase the overall performance of a CMOS circuit, the transistors are integrated in an increasingly dense layout. The distance d between two adjacent gates 10 is thus reduced to a minimum. In order to increase the performance of individual transistors, compressive or tensile films, also known as "stress liners" (for example CESL: "Contact Etch Stop Liner" or DSL: "Dual Stress Liner") can be deposited on the gates 10 of the transistors.

FIGS. 2A and 2B respectively show a diagram and a transmission electron microscopy (TEM) image of two adjacent gates 10, via sectional views along a cutting plane xz. The cutting plane is of the BB type, as shown in FIG. 1A, and passes through the isolating trench 30. In these FIG. 2A, 2B, the transistor gates 10 comprise silicided portions 12, and are flanked by first spacers 11a and second spacers 11b. A stress liner 40 covers the gates 10 and the spacers 11a, 11b more or less conformally. Ideally, a gap fill layer 50 made of a dielectric material, known as an ILD (Inter-Layer Dielectric), covers the stress liner 40 and fills the gaps between the sides of two adjacent gates 10.

When the distance d between two gates is small and/or the thickness of the stress liner 40 is large, the height/width form factor of the gaps to be filled increases. The gaps become difficult to fill completely. This leads to the formation of "closed" cavities 31, or residual voids, as shown in FIG. 2A, 2B.

These voids 31 extend along the gates 10, from one active area 20 to the other, as diagrammatically shown in FIG. 3A, and pictured in FIG. 3B. They can have negative consequences for CMOS circuits. During the subsequent formation of the electrical contacts at the silicided portions, and in particular when a problem with the alignment of these electrical contacts arises, the voids can be opened and filled with metal.

Two adjacent active areas 20 normally electrically isolated from one another by the STI 30, are thus short-circuited by an electrical connection via these metallised voids 31. FIG. 4A, 4B diagrammatically show two short-circuit situations between different types of contacts 21, 13, 14.

FIG. 4A shows a single-point gate contact 13 misaligned in the x direction towards the void 31. The metal of this contact 13 can directly or indirectly fill part of the void 31 and form a short-circuit 313 with the contact 21.

FIG. 4B shows an elongated gate contact 14 overlapping two adjacent gates 10. The metal of this contact 14 can directly or indirectly fill part of the void 31 and form a short-circuit 314 with the contact 21.

FIGS. 5A and 6A are overhead and sectional views respectively, acquired by electron microscopy, of the situation shown in FIG. 4A. FIGS. 5B and 6B are overhead and sectional views respectively, acquired by electron microscopy, of the situation shown in FIG. 4B.

In light of these drawbacks, a large gap must currently be maintained between two adjacent gates. One solution involves adding a step of etching the aforementioned spacers 11b. This increases the width of the gaps between the gates. However, this solution has other drawbacks, in particular in that it affects the other portions of the transistors, in particular the silicided portion, the semiconductor material of the active areas or the STIs.

FIG. 7A to 7F show the conventional steps for removing the spacers 11b, after silicidation of the gates. The silicidation of the gates allows the silicided portions 12 to be formed, i.e. with a nickel silicide NiSi base, on which the contacts 21, 13, 14 are subsequently formed (FIG. 7A). The spacers 11b have been previously formed at the STIs 30 (FIG. 7B). During the formation of the spacers 11b, the STIs 30 can be partially damaged, as shown in FIG. 7B. This can lead to the formation of "open" cavities 31, i.e. cavities that communicate with the surrounding environment. These open cavities 31 undergo changes during subsequent transistor manufacturing steps and can also contribute to the appearance of the closed voids 31 described hereinabove, i.e. in the form of a void volume within a solid material.

The spacers 11b are typically removed by isotropic etching (FIG. 7D). The cavities 31 are enlarged. Unwanted metal residues 120 are redeposited at the end of this step, as shown in FIG. 7C, 7D. A cleaning step, for example wet cleaning with a nitric acid-based solution, must thus be carried out to remove these metal residues 120 (FIG. 7E, 7F). This can further damage the STIs 30. This can also consume or damage part of the silicided portions.

There is thus a need to improve the current techniques employed for manufacturing microelectronic components.

The present invention in particular relates to a method for producing transistors which at least partially overcomes the aforementioned drawbacks.

In particular, one purpose of the present invention is to propose a method for manufacturing transistors comprising removing second spacers and limiting or eliminating the formation of residual voids.

Other purposes, features and advantages of the present invention will appear upon reading the following description and the accompanying drawings. It is understood that other advantages can be incorporated.

SUMMARY

One aspect of the invention relates to a method for producing a plurality of transistors on a substrate comprising at least two adjacent active areas separated by at least one electrically-isolating area, each transistor of the plurality of transistors comprising a gate having a silicided portion, and first spacers on either side of the gate, the first spacers being located on sides of the gate.

This method comprises the following steps of:
  forming the gates of the transistors,
  forming the first spacers,
  forming second spacers on sides of the first spacers,
  siliciding the gates so as to form the silicided portions of the gates,
  removing the second spacers.

Advantageously, the removal of the second spacers takes place during the silicidation of the gates and before the silicided portions are fully formed.

Thus, this removal does not affect the fully-formed silicided portions. This prevents or limits the deposition of unwanted metal residues. This advantageously makes it possible to dispense with the step of cleaning the metal residues.

Silicidation of the gate is typically carried out in a series of steps grouped under the name "NiSi module". This NiSi module can in particular comprise the following sub-steps of:

Carrying out at least one preparatory cleaning operation,

Depositing a nickel-platinum NiPt alloy, in particular at the tops of the gates, Carrying out a first thermal anneal so as to diffuse and react part of the Nickel Ni in said NiPt alloy at the upper portions of the gates, Carrying out an intermediate removal of the nickel-platinum NiPt alloy enriched with platinum Pt at the end of the first thermal anneal, Carrying out a second thermal anneal, Removing a residual part of NiPt alloy, so as to form and/or expose the silicided portions, i.e. those having a nickel silicide NiSi base.

The removal, in whole or in part, of the second spacers is carried out in this case before removing the residual part of NiPt alloy, preferably immediately before removing the residual part of NiPt alloy, preferably before the second thermal anneal, preferably before depositing the nickel-platinum NiPt alloy, and preferably before the at least one preparatory cleaning.

The invention further relates to transistors obtained by the described aspects of the method of the invention.

According to another aspect, the invention further relates to a method for producing a plurality of transistors on a substrate comprising at least two adjacent active areas separated by at least one electrically-isolating area, each transistor of the plurality of transistors comprising a gate having a silicided portion, and first and second spacers on either side of the gate, the first spacers being located on sides of the gate and the second spacers being located on sides of the first spacers.

This method comprises the following steps of:

forming the gates of the transistors, forming the first spacers, forming the second spacers, siliciding the gates so as to form the silicided portions of the gates, said silicidation of the gates comprising the following sub-steps of:

i. Depositing a nickel-platinum NiPt alloy at the tops of the gates, ii. Carrying out a first thermal anneal so as to diffuse and react part of the Nickel Ni in said NiPt alloy at the upper portions of the gates, iii. Carrying out an intermediate removal of the nickel-platinum NiPt alloy enriched with platinum Pt, iv. Removing a residual part of unreacted NiPt alloy so as to form the silicided portions, removing the second spacers.

Advantageously, the removal of the second spacers takes place during the silicidation of the gates before the silicided portions are fully formed, after the intermediate removal, preferably immediately thereafter, and before the removal of the residual part.

BRIEF DESCRIPTION OF THE FIGURES

Aims, purposes, features and advantages of the invention will be better understood upon reading the detailed description of one embodiment thereof, which is illustrated by means of the following accompanying drawings, in which:

FIG. 2A diagrammatically shows a sectional view of two adjacent transistors and a residual void therebetween.

FIG. 2B is an electron microscopy image showing a sectional view of two adjacent transistors and a residual void therebetween, as shown in FIG. 2A.

FIG. 3A diagrammatically shows an overhead view of two adjacent transistors and a residual void therebetween.

FIG. 3B is an electron microscopy image showing an overhead view of two adjacent transistors and a residual void therebetween, as shown in FIG. 3A.

FIG. 12A diagrammatically shows a sectional view of a device comprising two adjacent gates before silicidation of the gates and removal of the second spacers.

FIG. 12B shows a flow chart of the silicidation and second spacer removal steps, according to one embodiment of the present invention.

FIG. 12C diagrammatically shows a sectional view of a device comprising two adjacent gates after silicidation of the gates and removal of the second spacers, according to one embodiment of the present invention.

Figure 1A:
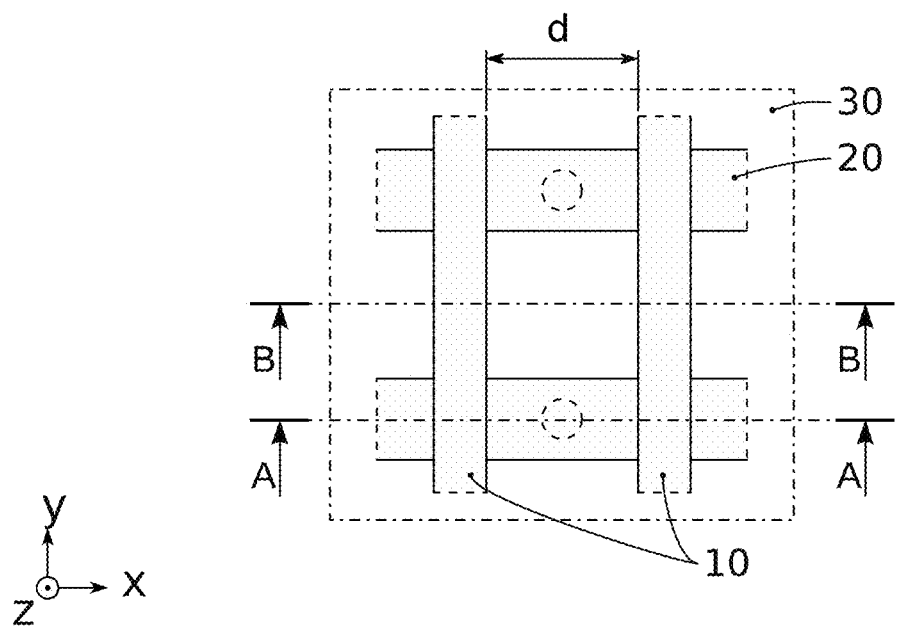
FIG. 1A diagrammatically shows an overhead view of a substrate comprising active areas and adjacent electrically-isolating areas, on which transistor gates are disposed.
Figure 4A:
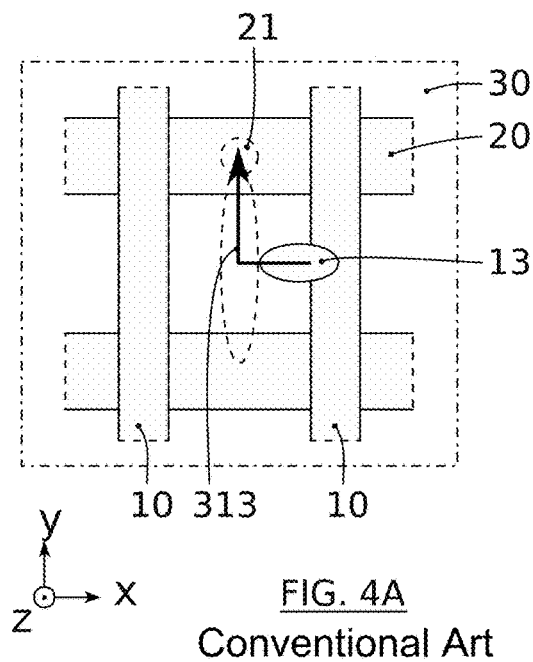
FIG. 4A diagrammatically shows an overhead view of a first short-circuit situation via the residual void shown in FIG. 3A.
Figure 4B:
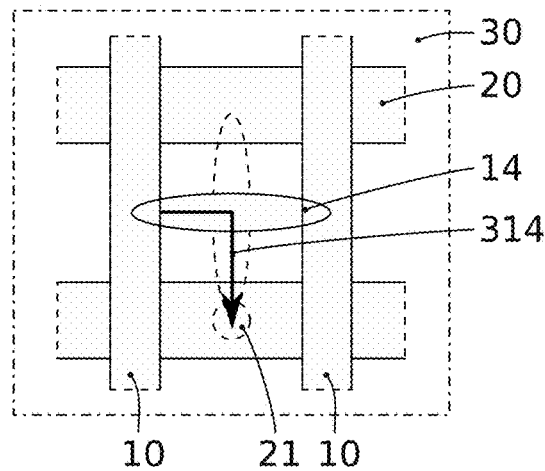
FIG. 4B diagrammatically shows an overhead view of a second short-circuit situation via the residual void shown in FIG. 3A.
Figure 5A:
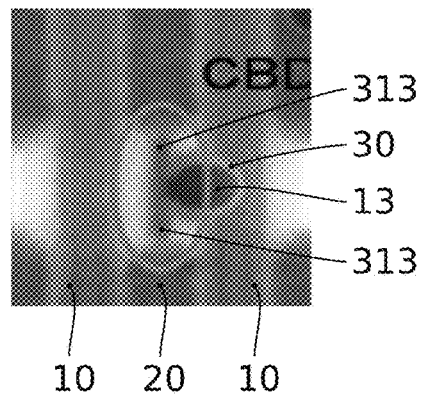
FIG. 5A is an electron microscopy image showing an overhead view of a first short-circuit situation, as shown in FIG. 4A.
Figure 5B:
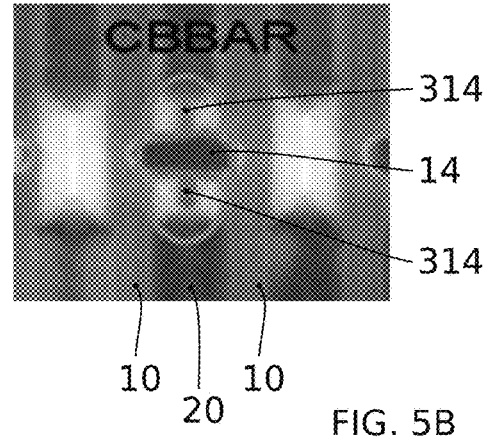
FIG. 5B is an electron microscopy image showing an overhead view of a second short-circuit situation, as shown in FIG. 4B.
Figure 6A:
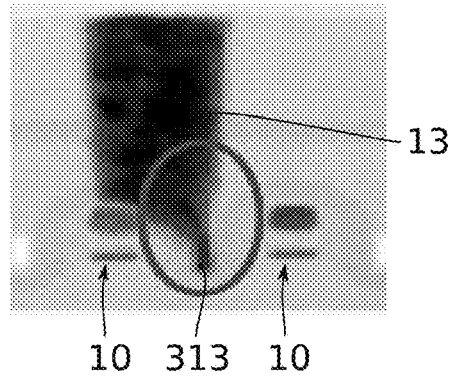
FIG. 6A is an electron microscopy image showing a sectional view of a first short-circuit situation, as shown in FIG. 4A.
Figure 6B:
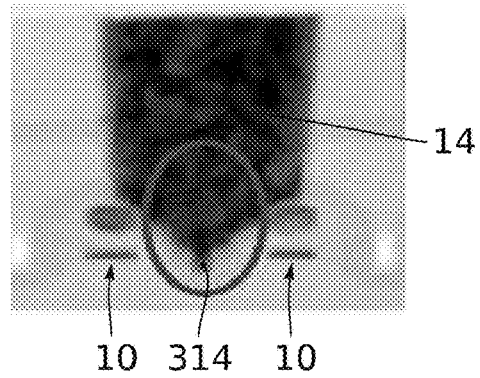
FIG. 6B is an electron microscopy image showing a sectional view of a second short-circuit situation, as shown in FIG. 4B.
Figure 7A:
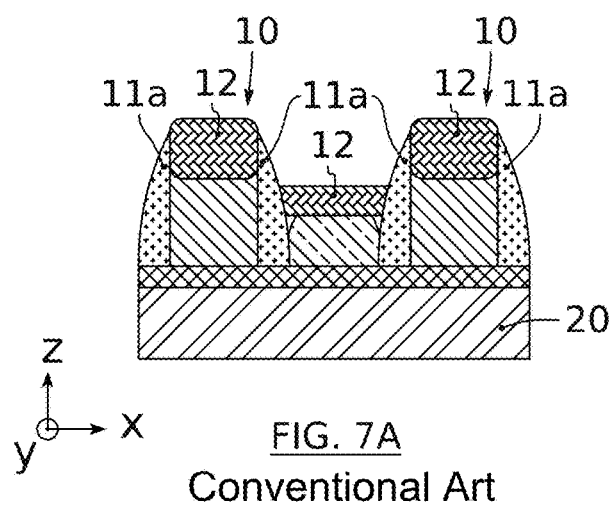
FIG. 7A to 7F show steps for removing the second spacers, according to the prior art.
Figure 7B:
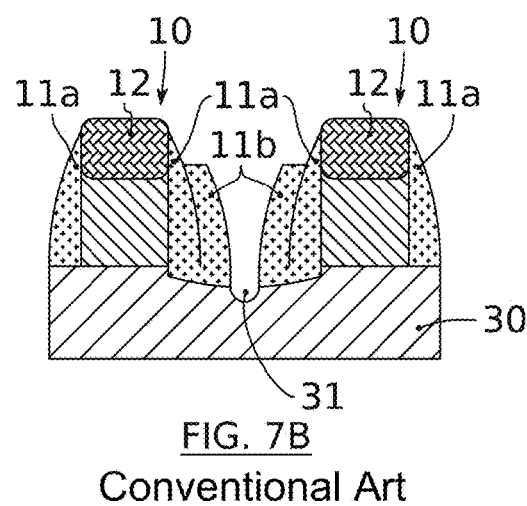
Figure 7C:
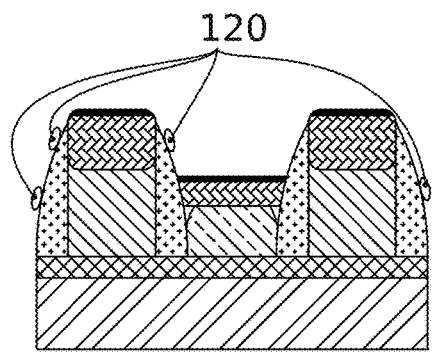
Figure 7D:
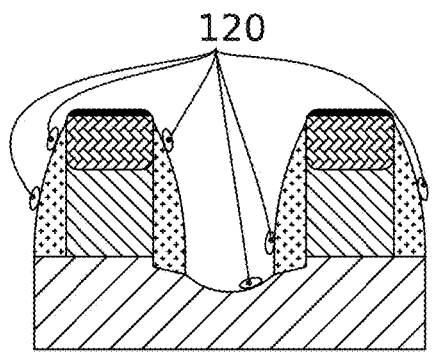
Figure 7E:
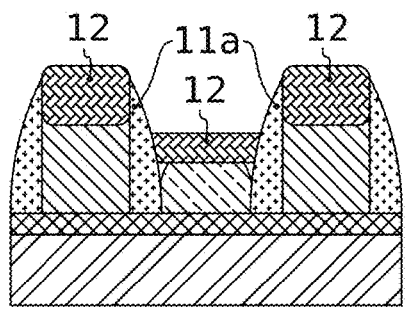
Figure 7F:
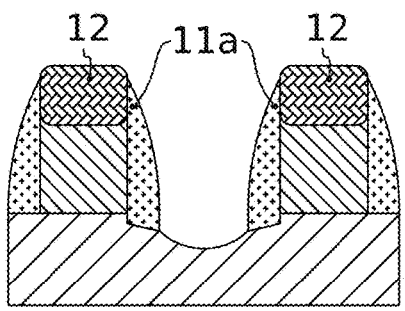

The drawings are provided by way of example and are not intended to limit the scope of the invention. They constitute diagrammatic views intended to ease the understanding of the invention and are not necessarily to the scale of practical applications. In particular, the relative thicknesses of the different films and portions are not representative of reality.

DETAILED DESCRIPTION

Before giving a detailed description of the embodiments of the invention, it should be noted that the invention according to the first aspect thereof in particular comprises the optional features given hereinbelow, which can be used in combination with one another or alternately:

According to one example, the silicidation of the gates comprises the following sub-steps of:
  Depositing a nickel-platinum NiPt alloy at the tops of the gates,
  Carrying out a first thermal anneal so as to diffuse and react part of the Nickel Ni in said NiPt alloy at the upper portions of the gates,
  Removing a residual part of NiPt alloy so as to form the silicided portions.

According to one example, the removal of the second spacers takes place before removing the residual part. Thus, the metal residues generated during the removal of the second spacers are eliminated during the removal of the residual part. This makes it possible to dispense with a later step of cleaning the metal residues. This dispenses with one step of the method.

According to one example, the removal of the second spacers takes place before depositing the nickel-platinum NiPt alloy at the tops of the gate. Thus, the metal residues generated during the removal of the second spacers are eliminated during the removal of the residual part. This makes it possible to dispense with a later step of cleaning the metal residues. This dispenses with one step of the method.

According to one example, the method further comprises, before depositing the nickel-platinum NiPt alloy at the tops of the gates, the following sub-steps of:
  Carrying out a preparatory thermal anneal,
  Carrying out at least one preparatory cleaning operation.

According to one example, the removal of the second spacers takes place before the at least one preparatory cleaning operation. This prevents the generation of metal residues. This makes it possible to dispense with a later step of cleaning the metal residues. The at least one preparatory cleaning operation further removes the organic residues generated by the removal of the second spacers. If the removal of the second spacers is carried out by isotropic wet etching with a dilute hydrofluoric acid (dHF) solution, the at least one preparatory cleaning is not necessary and can be omitted. This dispenses with at least one second step of the method.

According to one example, the removal of the second spacers takes place after the at least one preparatory cleaning operation and before depositing the nickel-platinum NiPt alloy at the tops of the gate. This prevents the generation of metal residues. This makes it possible to dispense with a later step of cleaning the metal residues. If the removal of the second spacers is carried out by isotropic plasma etching from a remote plasma followed by sublimation annealing, the deposition of the nickel-platinum NiPt alloy can be carried out directly without the need for a conventional surface deoxidation step in preparation for deposition. This dispenses with a second step of the method.

According to one example, the removal of the second spacers takes place immediately before removing the residual part.

According to one example, the method further comprises, after the first thermal anneal, carrying out an intermediate removal of the nickel-platinum NiPt alloy enriched with platinum Pt at the end of the first thermal anneal. This intermediate removal is typically followed by a second thermal anneal. The intermediate removal step serves essentially to remove excess metal, in particular unreacted metal from the tops of the gates—the intermediate NiPt alloy—and/or from the STIs and/or from the spacers. At the end of the intermediate removal step, a Ni-rich phase is retained at the tip of the gates. The second thermal anneal allows for further diffusion of the nickel from the tip of the gates so as to obtain the NiSi-based silicided portions.

According to one example, the removal of the second spacers takes place after said intermediate removal, and preferably immediately after and preferably before the second thermal anneal. The Ni-rich phase is more resistant than the underlying (partly silicided) NiSi portion to the removal of the second spacers. The partially silicided portion is thus not damaged. The generation of metal residues is thus limited. Moreover, the metal residues are eliminated when the platinum is removed. This makes it possible to dispense with a later step of cleaning the metal residues. This dispenses with one step of the method.

According to one example, the second spacers are formed directly on the sides of the first spacers, i.e. without any intermediate film therebetween.

According to one example, the first spacers have a SiO2, or SiN, or Si3N4, or SiON, or SiOx base or a base made of another Si, 0, C, N-based dielectric material.

According to one example, the second spacers have a SiO2, or SiN, or Si3N4, or SiON, or SiOx base or a base made of another Si, 0, C, N-based dielectric material.

According to one example, the first spacers have a base made of a different material to that of the second spacers.

According to one example, the removal of the second spacers is carried out by isotropic plasma etching.

According to one example, the isotropic plasma etching uses a fluorocarbon species. This allows nitride-based spacers to be etched quickly while having good selectivity with respect to the silicon oxide of the STI isolating trenches.

According to one example, the isotropic plasma etching is carried out using a remote plasma followed by sublimation annealing. Such etching can be a SiCoNi®-type method.

According to one example, the removal of the second spacers is carried out by isotropic wet etching.

According to one example, the isotropic wet etching uses a solution of dilute hydrofluoric acid (dHF) and hot phosphoric acid. This allows nitride-based spacers to be etched quickly while having good selectivity with respect to the silicon oxide of the STI isolating trenches.

According to one example, the isotropic wet etching uses a solution of dilute hydrofluoric acid (dHF).

It is specified that, within the scope of the present invention, the terms "on", "overlying". "covers" or "underlying"

or the equivalents thereof do not necessarily mean "in contact with". Thus, for example, the deposition of a first film on a second film does not necessarily mean that the two films are directly in contact with one another, but rather means that the first film covers at least partially the second film while being either directly in contact therewith, or while being separated therefrom by at least one other film or at least one other element.

Moreover, a film can be constituted by a plurality of sub-films made of the same material or made of different materials.

A substrate, film, or device "based on" a material M is understood to mean a substrate, a film, or a device comprising this material M only or comprising this material M and optionally other materials, for example alloying elements, impurities or doping elements. Thus, a spacer having a silicon nitride SiN base can, for example, comprise non-stoichiometric silicon nitride (SiN) or stoichiometric silicon nitride (Si3N4), or even a silicon oxynitride (SiON).

In general, however without being limiting, a spacer forms a ring around the gate, with a closed contour; this can be referred to as a single spacer around the gate; however, the sectional views and the preferred directions of the gates also require the mention of pairs of spacers. The latter terminology is used herein, which differentiates in this application between a pair of first spacers and a pair of second spacers.

The present invention in particular allows at least one transistor or a plurality of transistors to be manufactured on a substrate. This substrate can be a "bulk" substrate, or even of the semiconductor on insulator type, for example a silicon on insulator (SOI) substrate or a germanium on insulator (GeOI) substrate.

The invention can also be implemented more widely for various microelectronic devices or components.

A microelectronic component, device or device element is understood to mean any type of element made using microelectronic means. In addition to devices intended for purely electronic purposes, these devices in particular include micromechanical or electromechanical devices (MEMS, NEMS, etc.) as well as optical or optoelectronic devices (MOEMS, etc.).

Several embodiments of the invention implementing successive steps of the manufacturing method are described hereinbelow. Unless specified otherwise, the adjective "successive" does not necessarily imply that the steps immediately follow on from one another, although this is generally preferred, and they can be separated by intermediate steps. Moreover, the term "step" is understood to mean the performance of a part of the method, and can denote a set of sub-steps.

Figure 8:
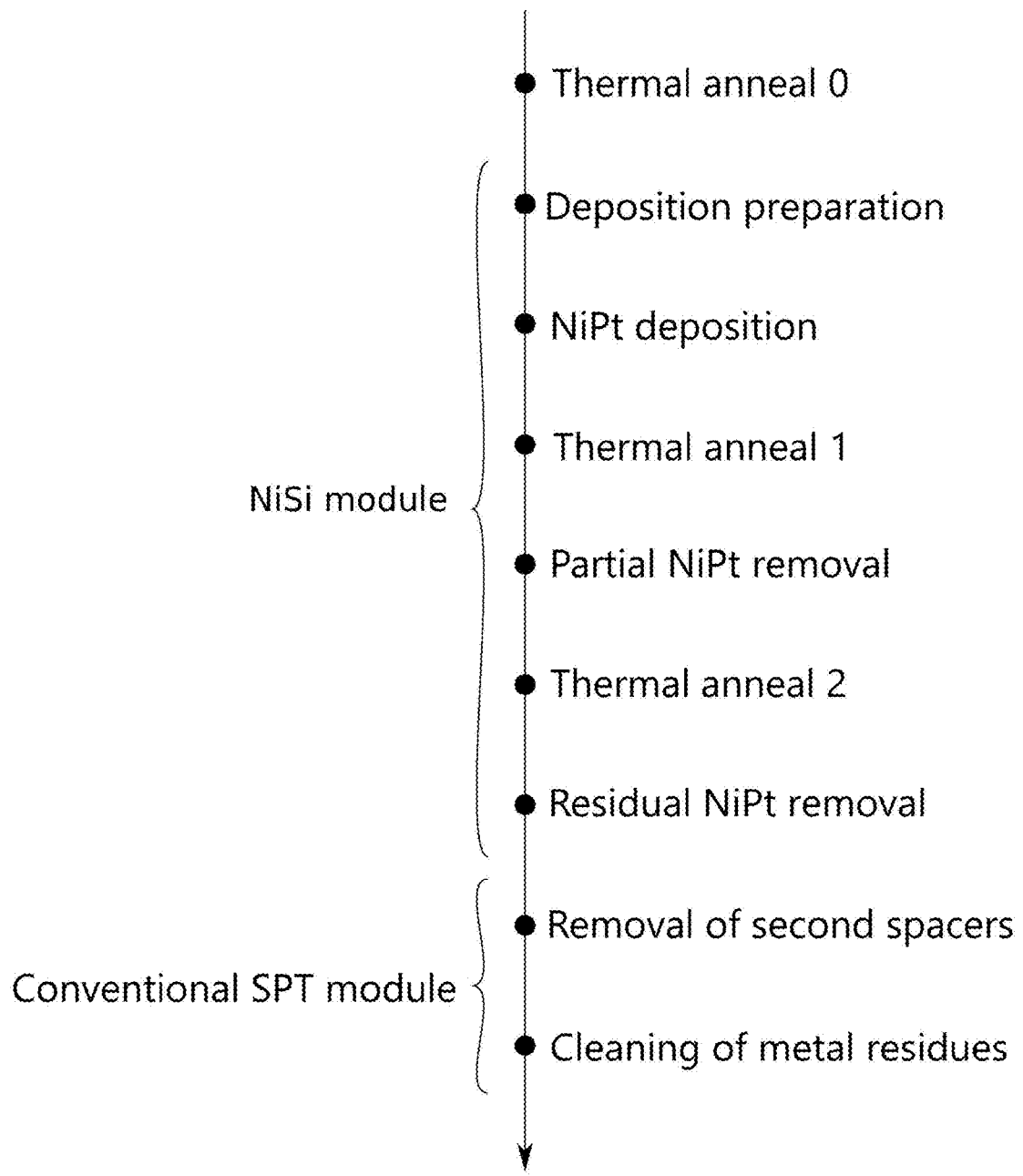
FIG. 8 shows a flow chart of the silicidation and second spacer removal steps, according to the prior art.

Silicidation typically comprises a set of steps to form NiSi-based portions or parts of the device. This set of steps, grouped under the name "NiSi module", is shown in FIG. 8.

One objective of silicidation is to diffuse and then react a metal, generally nickel, within semiconductor portions, generally having a Si base, from a metal source, generally a NiPt alloy deposited on the surface of said semiconductor portions. As shown in FIG. 8, the silicidation can thus comprise one or more "deposition preparation" steps allowing the surfaces to be cleaned, a "NiPt deposition" step, a first "thermal anneal 1" allowing nickel diffusion to be initiated, an optional intermediate "partial NiPt removal" step allowing excess metal to be removed, an optional second "thermal anneal 2" allowing nickel diffusion to be continued or finalised, and a "removal of the residual part of NiPt alloy" step finalising silicidation.

Silicidation is carried out at least at the upper portions of the gates of the transistors. It is generally also carried out on upper portions of sources and drains, that are for example raised, on either side of the transistor.

The upper portions can be gradually enriched with Ni during silicidation to become the "silicided" portions. The silicided portions are effectively silicided, i.e. fully formed, at the end of the silicidation operation. The upper and/or silicided portions do not necessarily have a constant concentration of nickel throughout the height thereof. For the sake of brevity and depending on the case, the upper portions can also refer to the portions "in the process of silicidation" or "intended to be silicided". The purpose of these upper portions is perfectly clear to a person skilled in the art, as a function of the silicidation step with which they are associated.

Silicidation can be carried out in a plurality of steps using a NiPt deposit. The initially deposited NiPt alloy undergoes changes during the silicidation steps. Typically, the nickel concentration of the initial NiPt alloy varies during silicidation. For example, after a first thermal anneal in which nickel is diffused, the initial NiPt alloy is enriched with Pt. The initial alloy thus becomes an intermediate NiPt alloy, enriched with Pt, which can be removed by an intermediate removal operation. After a second thermal anneal intended to finalise the diffusion and the reaction of the nickel within the upper portions, a residual part of the NiPt alloy remains. This residual part is removed at the end of the silicidation module. A distinction can optionally be made between the initial NiPt alloy, the intermediate NiPt alloy, and the final or residual NiPt alloy, which have different nickel concentrations. The residual part has a final NiPt alloy base.

Nickel is a relatively mobile element that can diffuse rapidly depending on the thermal budget to which it is subjected. It can in particular diffuse from NiPt or NiSi alloy metal residues at the base of the gates, and optionally perforate and short-circuit the junction between the source or drain, and the channel. Such a phenomenon is commonly referred to as NiSi piping. The metal residues can originate from re-deposition after an etching or cleaning step. These metal residues are undesirable. They are preferably, or necessarily, eliminated to prevent any risk of "NiSi piping" (the last step of the "conventional SPT module" of a known, standard method shown in FIG. 8).

Another advantage of the method according to the invention is that it limits or eliminates this "NiSi piping" phenomenon. The different embodiments of the method according to the invention:
  prevent the generation of metal residues during the removal of the second spacers (case whereby the removal of the second spacers is carried out before the deposition of the NiPt alloy),
  or protect the portions being silicided by keeping a Ni-rich alloy on the surface of said portions (case whereby the removal of the second spacers is carried out before the second thermal anneal),
  or remove the metal residues at the same time as the silicidation of the upper portions is finalised (case whereby the removal of the second spacers is carried out before the removal of the platinum).

The method according to the invention also allows the upper and/or silicided portions to be preserved and damage thereto to be avoided.

A NiPt deposition "at the tops of the gates" is understood to mean a NiPt deposition at least at the tops of the gates. This does not mean that NiPt deposition occurs only at the tops of the gates. Generally, full-wafer NiPt deposition is carried out, i.e. non-selectively on all the structures present on the wafer. NiPt deposition is thus also carried out, for example, on the sources and drains of the transistors. By way of example, within the scope of the present invention, the silicidation subsequent to this NiPt deposition is mainly described for the gates, in particular at the tops of the gates, hence the expression.

The terms "gate pattern", "gate stack" and "gate" are used synonymously.

The present patent application preferentially employs the term thickness for a film, height for a device (for example a transistor or gate) and depth for a cavity or an etch. The thickness is considered in a direction normal to the main plane of extension of the film, the height and the depth are considered in a direction normal to the base plane of the substrate.

Dry etching solutions, i.e. plasma etching, using fluorocarbon species suitable for the removal of the second spacers, are generally known to a person skilled in the art. A CH3F/O2 plasma can typically be used to remove silicon nitride-based second spacers with a good etch rate and good selectivity with respect to silicon oxide.

Wet etching solutions suitable for the removal of the second spacers are known to a person skilled in the art. Thus, a diluted hydrofluoric acid typically corresponds to a dilution of less than 30 vol. %, preferably less than 20 vol. %, and preferably comprised between 1 vol. % and 5 vol. %. A hot phosphoric acid typically has a temperature comprised between 100° C. and 150° C.

The terms "substantially", "about", and "in the order of" mean "to within 10%" or, when referring to an angular orientation, "to within 10°". Thus, a direction substantially normal to a plane means a direction having an angle of 90±10° relative to the plane.

The method for manufacturing transistors will now be described in detail via a plurality of embodiments.

In all embodiments of the manufacturing method according to the invention, the removal of the second spacers is carried out by isotropic, dry or wet etching. For second spacers having a silicon nitride (SiN) base, four etching solutions or etch chemistries, from among other possibilities, hereafter referred to as CHIM 1, CHIM 2, CHIM 3 and CHIM 4, can be used.

The etching solution CHIM 1 corresponds to isotropic plasma etching using fluorocarbon species, typically a CH3F/O2 mixture. Such a solution has both a good SiN etch rate and a good selectivity with respect to SiO2.

The etching solution CHIM 2 corresponds to isotropic plasma etching using a remote plasma followed by sublimation annealing, typically by a SiCoNi™ type method. The remote plasma can have an NF3/NH3 mixture base. The NF3/NH3 concentration ratio can be chosen between 0.05 and 0.3, for example 0.07 or 0.12 or 0.2 or preferably 0.175 or 0.25. The latter two concentration ratios represent a good compromise between the etch rate (in Å/min) and selectivity with respect to SiO2 (SiN/SiO2), as shown in the following table:

| NF3/NH3 concentration ratio | SiN etch rate (in Å/min) | SiO2 etch rate (in Å/min) | SiN/SiO2 selectivity |
|---|---|---|---|
| 0.2 | 207 | 17 | 12.1 |
| 0.12 | 133 | 10 | 13.3 |
| 0.07 | 90 | 7 | 12.85 |
| 0.175 | 154 | 18 | 8.5 |
| 0.25 | 182 | 21 | 8.6 |

Further advantages of this etching solution CHIM 2 are described hereinbelow.

The etching solution CHIM 3 corresponds to isotropic wet etching using a solution of dilute hydrofluoric acid (dHF) and hot phosphoric acid (H3PO4). Such a solution has both a good SiN etch rate and a good selectivity with respect to SiO2.

The etching solution CHIM 4 corresponds to isotropic wet etching using a solution of dilute hydrofluoric acid (dHF) alone. Some advantages of this etching solution CHIM 4 are described hereinbelow.

In all of the embodiments of the manufacturing method according to the invention, the removal of the second spacers takes place during the NiSi module dedicated to silicidation, before the end of said NiSi module, which corresponds to the removal of the residual part. The first and second embodiments provide for the removal of the second spacers before the NiPt metal deposition. This advantageously prevents any subsequent interaction with the NiPt metal. In particular, this prevents partial sputtering of the NiPt- and/or NiSi-based metal parts. This prevents the subsequent formation of metal residues. The third and fourth embodiments provide for the removal of the second spacers before the removal of the residual part. This advantageously uses the step of removing the residual part to also remove or clean the metal residues.

In all cases, a subsequent metal residue cleaning step is no longer necessary. This reduces the total number of steps in the manufacturing method. The elimination of the metal residue cleaning step, which often aggresses silicon oxide, further preserves the STI isolating trenches. This thus reduces the consumption of silicon oxide in the post-silicidation STIs. The height/width form factor of the gaps to be filled between two adjacent gates is reduced. This allows the gaps to be filled later without voids forming.

Figure 9A:
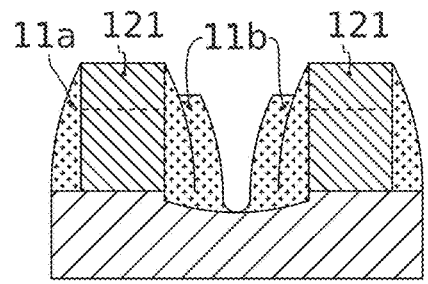
FIG. 9A diagrammatically shows a sectional view of a device comprising two adjacent gates before silicidation of the gates and removal of the second spacers.
Figure 9B:
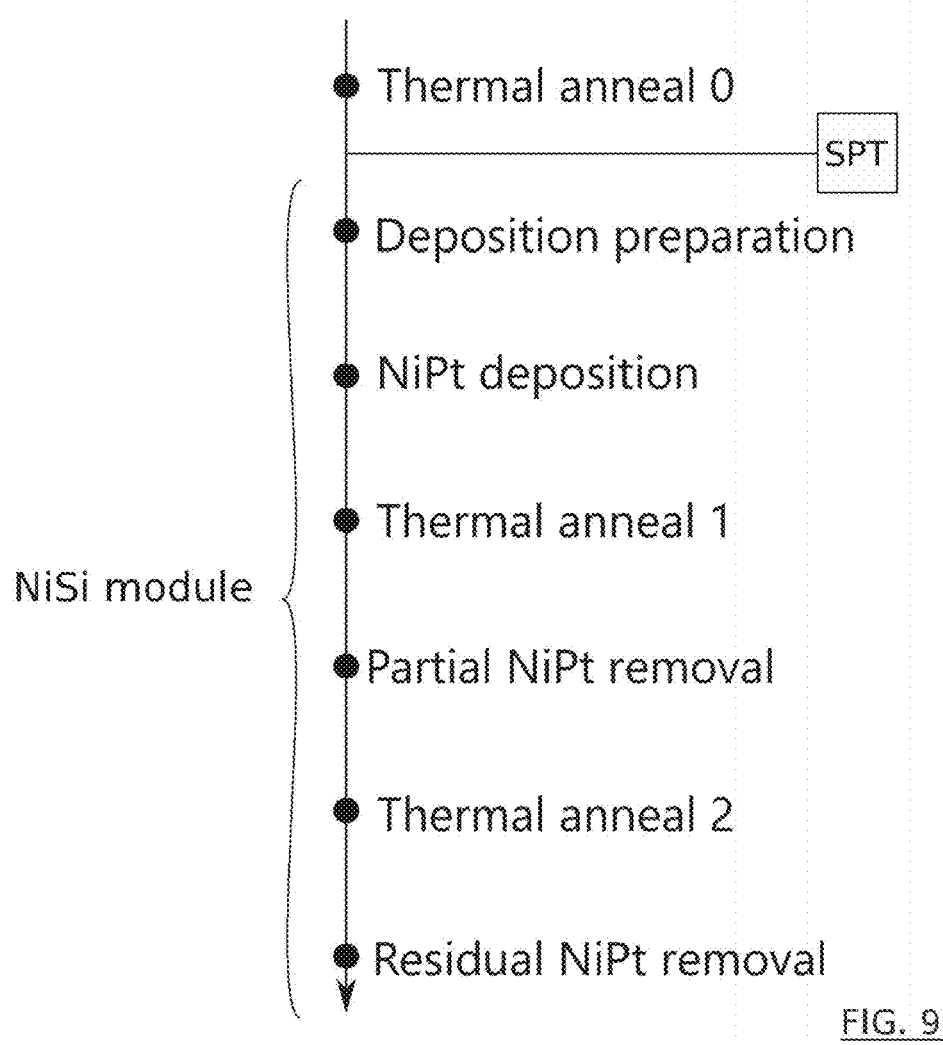
FIG. 9B shows a flow chart of the silicidation and second spacer removal steps, according to one embodiment of the present invention.
Figure 9C:
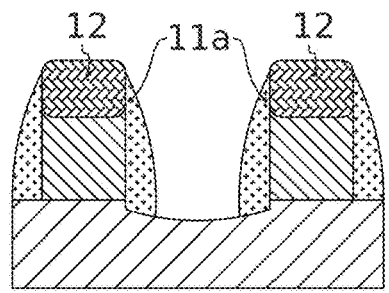
FIG. 9C diagrammatically shows a sectional view of a device comprising two adjacent gates after silicidation of the gates and removal of the second spacers, according to one embodiment of the present invention.

The first embodiment is shown in FIG. 9A to 9C. FIG. 9A shows a sectional view of two adjacent gates flanked by the first spacers 11a and the second spacers 11b, prior to the silicidation of the upper portions 121. FIG. 9B shows the positioning of the step of removing the second spacers 11b, also known as SPT (Spacer Proximity Technology), in the sequence of steps of the NiSi module. FIG. 9C shows a sectional view of two adjacent gates flanked by the first spacers 11a and comprising silicided portions 12, as obtained at the end of the NiSi module modified by the SPT step.

According to this first embodiment, the removal of the second spacers 11b is carried out at the very beginning of the NiSi module, before the "deposition preparation" step. Such a "deposition preparation" step is generally aimed at removing native oxide and/or impurities, for example of the organic or metallic type, at the tip of the gates and/or the sources and drains. It can comprise at least one preparatory cleaning operation. For example, a first preparatory wet cleaning operation can be carried out using a solution of dilute hydrofluoric acid dHF. A second dry cleaning operation, for example using Ar or He plasma, can be carried out directly in the deposition machine just before the metal deposition. Preparatory cleaning can thus comprise either or both dry and wet cleaning operations.

The SPT can take place with the different etch chemistries CHIM 1, CHIM 2, CHIM 3 and CHIM 4. Preferably, the use of the etch chemistry CHIM4 (dHF) replaces and eliminates the "deposition preparation" step. This further reduces the total number of steps in the manufacturing method.

Figure 10A:
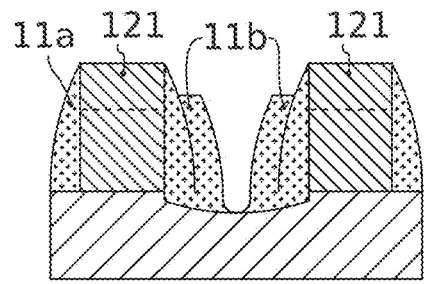
FIG. 10A diagrammatically shows a sectional view of a device comprising two adjacent gates before silicidation of the gates and removal of the second spacers.
Figure 10B:
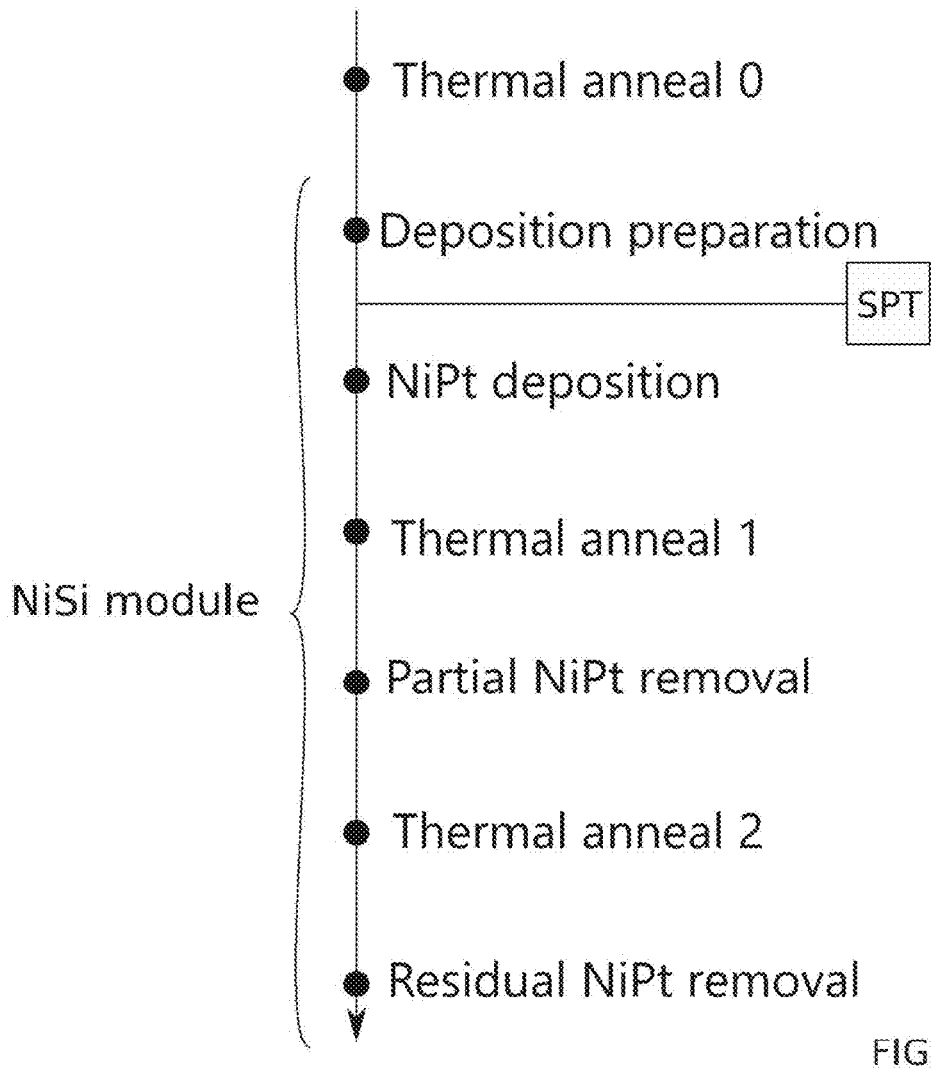
FIG. 10B shows a flow chart of the silicidation and second spacer removal steps, according to one embodiment of the present invention.
Figure 10C:
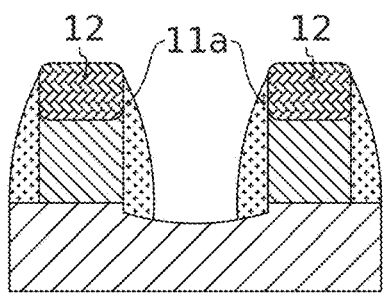
FIG. 10C diagrammatically shows a sectional view of a device comprising two adjacent gates after silicidation of the gates and removal of the second spacers, according to one embodiment of the present invention.

The second embodiment is shown in FIG. 10A to 10C. FIG. 10A shows a sectional view of two adjacent gates flanked by the first spacers 11a and the second spacers 11b, prior to the silicidation of the upper portions 121. FIG. 10B shows the positioning of the SPT step in the sequence of steps of the NiSi module. FIG. 10C shows a sectional view of two adjacent gates flanked by the first spacers 11a and comprising silicided portions 12, as obtained at the end of the NiSi module modified by the SPT step.

According to this second embodiment, the removal of the second spacers 11b takes place immediately after the "deposition preparation" step, before the NiPt deposition step. The NiPt deposition can typically comprise, prior to the actual deposition, a prior soft etching aiming at removing any remaining contaminants and ensure that no interfacial oxide is present prior to deposition. This prior soft etching can be carried out via a SiCoNi™-type method.

The SPT can take place with the different etch chemistries CHIM 1, CHIM 2, CHIM 3 and CHIM 4. Preferably, the use of the etch chemistry CHIM2 (SiCoNi®) replaces and eliminates the soft etching step of the NiPt deposition. This further reduces the total number of steps in the manufacturing method.

Figure 11A:
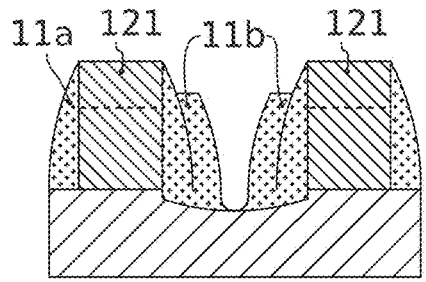
FIG. 11A diagrammatically shows a sectional view of a device comprising two adjacent gates before silicidation of the gates and removal of the second spacers.
Figure 11B:
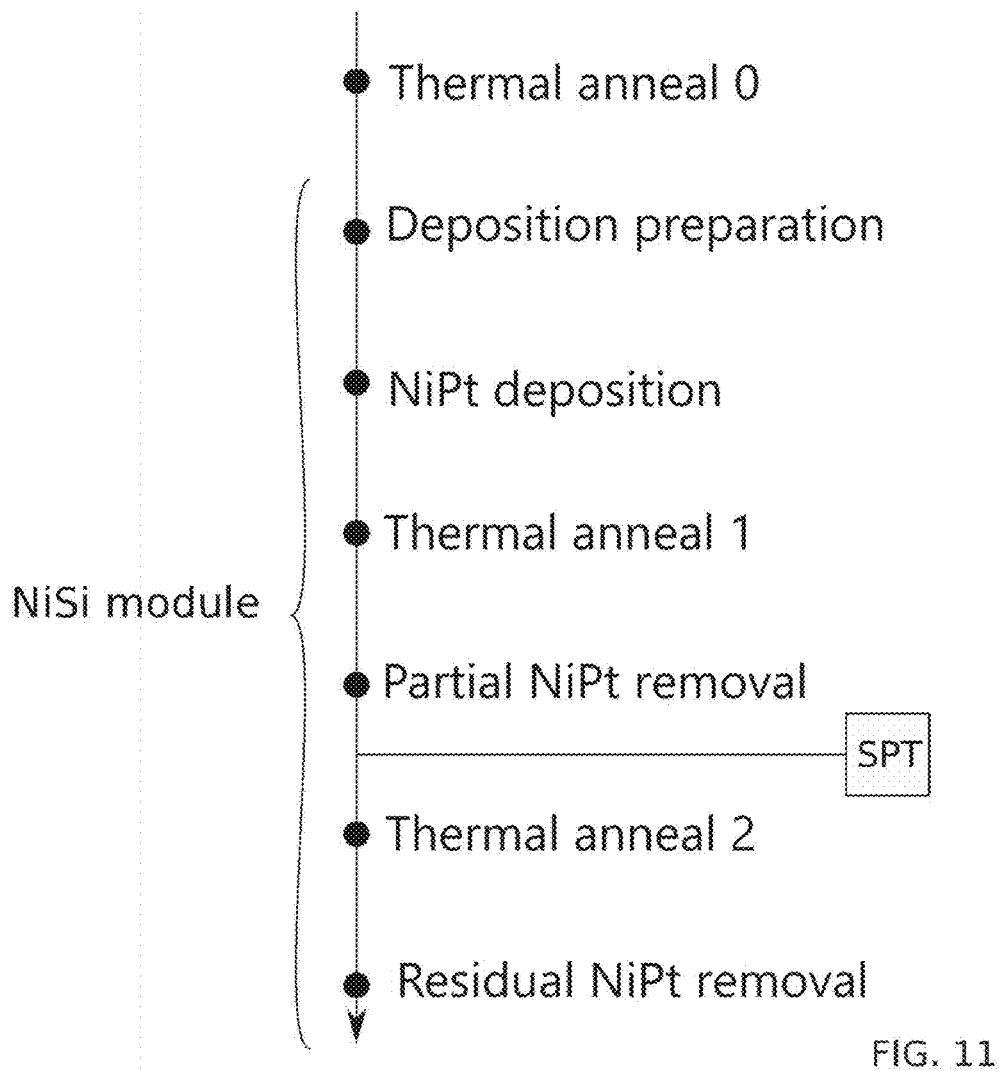
FIG. 11B shows a flow chart of the silicidation and second spacer removal steps, according to one embodiment of the present invention.
Figure 11C:
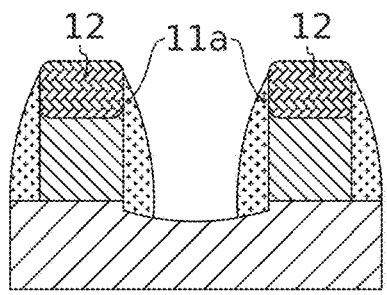
FIG. 11C diagrammatically shows a sectional view of a device comprising two adjacent gates after silicidation of the gates and removal of the second spacers, according to one embodiment of the present invention.

The third embodiment is shown in FIG. 11A to 11C. FIG. 11A shows a sectional view of two adjacent gates flanked by the first spacers 11a and the second spacers 11b, prior to the silicidation of the upper portions 121. FIG. 11B shows the positioning of the SPT step in the sequence of steps of the NiSi module. FIG. 11C shows a sectional view of two adjacent gates flanked by the first spacers 11a and comprising silicided portions 12, as obtained at the end of the NiSi module modified by the SPT step.

According to this third embodiment, the removal of the second spacers 11b takes place before the "thermal anneal 2" step, preferably immediately after the "partial NiPt removal" step. The thermal anneal 2 can be rapid thermal annealing known as RTA or laser annealing. The thermal anneal 2 in particular allows the diffusion and reaction of the nickel in the upper portions 121 to be finalised so as to obtain the silicided portions 12.

The SPT can take place with the different etch chemistries CHIM 1, CHIM 2, CHIM 3 and CHIM 4. The use of the wet etch chemistries CHIM3 (dHF+H3PO4) or CHIM4 (dHF) allows the NiSi-based portions undergoing silicidation to be preserved. More specifically, these have a nickel-rich phase at the interface with the upper metal deposit prior to the thermal anneal 2. This Ni-rich phase is more resistant than the NiSi alloy to said wet etch chemistries, and protects the underlying NiSi-based portions. In particular, the Ni-rich phase is less susceptible to damage by said wet etch chemistries than the NiSi alloy, and can be more easily restored by the thermal anneal 2. The use of the dry etch chemistries CHIM 1 (CH3F/O2) or CHIM2 (SiCoNi™) is preferably associated with a thermal anneal 2 by laser annealing. This prevents the NiSi piping phenomenon.

The fourth embodiment is shown in FIG. 12A to 12C. FIG. 12A shows a sectional view of two adjacent gates flanked by the first spacers 11a and the second spacers 11b, prior to the silicidation of the upper portions 121. FIG. 12B shows the positioning of the SPT step in the sequence of steps of the NiSi module. FIG. 12C shows a sectional view of two adjacent gates flanked by the first spacers 11a and comprising silicided portions 12, as obtained at the end of the NiSi module modified by the SPT step.

According to this fourth embodiment, the removal of the second spacers 11b takes place before the "Pt removal" step, preferably immediately after the "thermal anneal 2" step. The thermal anneal 2 can be rapid thermal annealing known as RTA or laser annealing.

The SPT can take place with the different etch chemistries CHIM 1, CHIM 2, CHIM 3 and CHIM 4. The use of the wet etch chemistries CHIM3 (dHF+H3PO4) or CHIM4 (dHF) allows the NiSi-based silicided portions to be preserved. More specifically, these are protected by the Pt-rich upper metal deposit, before the Pt is removed. When using the dry etch chemistries CHIM 1 (CH3F/O2) or CHIM2 (SiCoNi™), an additional laser anneal, at the end the NiSi module, can be carried out. This prevents the NiSi piping phenomenon.

In general, the invention is not limited to the embodiments described but extends to any embodiment within the scope of claim 1. Advantageously, the invention allows the total number of steps in a transistor manufacturing method to be reduced, while being conducive to the filling of the gaps between adjacent gates with an ILD without residual voids. The NiSi piping phenomenon is also reduced or even eliminated by the method according to the present invention.

The invention claimed is:

1. A method for producing a plurality of transistors on a substrate comprising at least two adjacent active areas separated by at least one electrically-isolating area, each transistor of the plurality of transistors comprising a gate having a silicided portion, and first spacers on either side of the gate, the first spacers being located on sides of the gate, the method comprising:
   forming the gates of the transistors,
   forming the first spacers,
   forming second spacers on sides of the first spacers,
   siliciding the gates so as to form the silicided portions of the gates, and
   removing the second spacers,
   wherein the removal of the second spacers takes place during the silicidation of the gates and before the silicided portions are fully formed.

2. The method according to claim 1, wherein the silicidation of the gates comprises:
   depositing a nickel-platinum NiPt alloy at tops of the gates,
   performing a first thermal anneal so as to diffuse and react part of the Nickel Ni in said NiPt alloy at upper portions of the gates, and
   removing a residual part of unreacted NiPt alloy so as to form the silicided portions,
   wherein the removal of the second spacers takes place before removing the residual part.

3. The method according to claim 2, wherein the removal of the second spacers takes place before depositing the nickel-platinum NiPt alloy at tops of the gate.

4. The method according to claim 3, further comprising, before depositing the nickel-platinum NiPt alloy at the tops of the gates:
   performing a preparatory thermal anneal, and
   performing at least one preparatory cleaning operation,
   wherein the removal of the second spacers takes place before the at least one preparatory cleaning operation.

5. The method according to claim 3, further comprising, before depositing the nickel-platinum NiPt alloy at the tops of the gates:
   performing a preparatory thermal anneal, and
   performing at least one preparatory cleaning operation,
   wherein the removal of the second spacers takes place after the at least one preparatory cleaning operation.

6. The method according to claim 2, wherein the removal of the second spacers takes place immediately before removing the residual part.

7. The method according to claim 2, further comprising, after the first thermal anneal, performing an intermediate removal of the nickel-platinum NiPt alloy enriched with platinum Pt at an end of the first thermal anneal, wherein the removal of the second spacers takes place after the intermediate removal.

8. The method according to claim 1, wherein the second spacers are formed directly on the sides of the first spacers.

9. The method according to claim 1, wherein the removal of the second spacers is performed by isotropic plasma etching.

10. The method according to claim 9, wherein the isotropic plasma etching uses fluorocarbon species.

11. The method according to claim 9, wherein the isotropic plasma etching is performed using a remote plasma followed by sublimation annealing.

12. The method according to claim 1, wherein the removal of the second spacers is performed by isotropic wet etching.

13. The method according to claim 12, wherein the isotropic wet etching uses a solution of dilute hydrofluoric acid (dHF) and hot phosphoric acid.

14. The method according to claim 12, wherein the isotropic wet etching uses a solution of dilute hydrofluoric acid (dHF).

* * * * *